United States Patent [19]

Neu

[11] Patent Number: 5,316,463
[45] Date of Patent: May 31, 1994

[54] ENCAPSULATING MOLDING EQUIPMENT
[75] Inventor: H. Karl Neu, Furlong, Pa.
[73] Assignee: Neu Dynamics Corporation, Ivyland, Pa.
[21] Appl. No.: 981,742
[22] Filed: Nov. 24, 1992
[51] Int. Cl.$^5$ .............. B29C 45/02; B29C 45/14; B29C 45/34; B29C 45/27
[52] U.S. Cl. .................. 425/116; 249/95; 264/272.17; 425/129.1; 425/184; 425/186; 425/544; 425/546; 425/588; 425/DIG. 228
[58] Field of Search ........... 425/812, 116, 121, 129.1, 425/544, 546, 588, DIG. 228, 192 R, 184, 186, 190; 264/272.17; 249/95, 91, 96, 141

[56] References Cited

U.S. PATENT DOCUMENTS

| 3,650,648 | 3/1972 | Lambrecht | 425/546 |
|---|---|---|---|
| 3,799,494 | 3/1974 | McLean, Jr. | 425/812 |
| 3,813,201 | 5/1974 | Frederick et al. | 425/812 |
| 3,859,023 | 1/1975 | Pasch | 425/DIG. 228 |
| 4,044,984 | 8/1977 | Shimizu et al. | 425/116 |
| 4,332,537 | 6/1982 | Slepcevic | 425/121 |
| 4,638,168 | 1/1987 | Slepcevic | 264/161 |
| 4,513,942 | 4/1985 | Creasman | 425/588 |
| 4,599,062 | 7/1986 | Konishi | 425/116 |
| 4,638,168 | 1/1983 | Slepcevic | 264/272 |
| 4,695,420 | 9/1987 | Grawey et al. | 264/265 |
| 4,779,835 | 10/1988 | Fukushima et al. | 425/588 |
| 4,812,114 | 3/1989 | Kennon et al. | 425/544 |
| 4,829,670 | 5/1989 | Hilgers | 29/882 |
| 4,861,251 | 8/1989 | Moitzger | 425/116 |
| 4,862,586 | 9/1989 | Osada | 264/272.17 |
| 4,944,908 | 7/1990 | Leveque et al. | 264/232 |
| 5,008,062 | 4/1991 | Anderson et al. | 264/27215 |
| 5,049,055 | 9/1991 | Yokoyama | 425/116 |
| 5,052,907 | 10/1991 | Matumoto et al. | 425/116 |
| 5,059,373 | 10/1991 | Hirabayashi | 264/154 |
| 5,077,237 | 12/1991 | Hara | 437/214 |
| 5,082,615 | 1/1992 | Sakai | 264/510 |
| 5,108,278 | 4/1992 | Tsutsumi et al. | 425/116 |
| 5,108,955 | 4/1992 | Ishida et al. | 437/214 |
| 5,123,823 | 6/1992 | Banjo et al. | 425/116 |
| 5,133,921 | 7/1992 | Yokoyama | 264/27215 |
| 5,174,942 | 12/1992 | Barnadas | 264/27215 |

FOREIGN PATENT DOCUMENTS

| 55-128835 | 10/1980 | Japan | 264/272.17 |
|---|---|---|---|
| 57-18210 | 1/1982 | Japan | 264/272.17 |
| 58-8608 | 1/1983 | Japan | 264/272.17 |
| 62-273814 | 11/1987 | Japan | 264/272.17 |
| 1-170088 | 7/1989 | Japan | 264/272.17 |
| 3-116939 | 5/1991 | Japan | 264/272.17 |
| 2104827 | 3/1983 | United Kingdom | 264/272.17 |

Primary Examiner—Khanh Nguyen
Attorney, Agent, or Firm—Synnestvedt & Lechner

[57] ABSTRACT

Encapsulation molding equipment includes individual mold bases each having an elongated shallow recess which receives strip-like carriers supporting semi-conductor chips and like objects for encapsulation. Cavity inserts having various numbers of cavities of different size and dimension individual to carriers having like numbers of chips of a range of size and dimension fit over the strips with each cavity on an insert surrounding the chip to be encapsulated. Gate and vent passages are formed on the surface of the insert spaced away from the mold base member for supply of resin from a central resin receptacle. The mold is completed by an upper mold insert plate which closes the mold and effects a seal between the mold parts and provides for delivery of encapsulating resin to the cavities in the cavity inserts. Each mold base has a plurality of recesses, each of which receives a carrier strip and a cavity insert.

9 Claims, 7 Drawing Sheets

ENCAPSULATING MOLDING EQUIPMENT

FIELD OF THE INVENTION

This invention relates to the encapsulation molding of objects mounted on a carrier strip and while not limited thereto is particularly directed to the encapsulation molding of electrical or electronic circuit components, such as semi-conductor chips previously fabricated on the carrier strip.

BACKGROUND OF THE INVENTION

Encapsulation molding equipment of the general kind referred to is disclosed, for example, in U.S. Pat. No. 4,368,168 dated Jan. 11, 1983. As disclosed in this patent, in the process manufacturing semi-conductor chips, elongated strips, usually made of copper or other conductive metal, and commonly called lead frames are provided. The strips of conductive metal are fabricated by stamping to form support platforms for the chips and electrical leads extending from each platform in predetermined pattern to the strip boundaries or to narrow cross pieces according to the design of the particular chips to be mounted on the support platforms. As a final step in the manufacturing process, the leads are eventually severed from the cross pieces and the boundaries after the chips are formed on the platforms, encapsulated and ready for testing and shipment.

In encapsulating the chips, an extreme degree of care must be taken to avoid handling. In the case of modern semi-conductor chips, the static electricity passing through the delicate microcircuitry on account of touching the unprotected chip, as well as the transfer of contaminants from the fingers of workers, may render it nonfunctional. In order to avoid this, considerable care must be taken to eliminate physical handling. This has been accomplished in the past by relatively expensive and complicated molds which have a large number of parts which are difficult to operate and to clean following use and are subject to undue wear and damage. In addition, known molding equipment is adaptable to encapsulation molding on only one size chip requiring there to be separate and rather complicated molds for each size chip or for each size of lead frame strip.

The molds of the invention are intended to be used in conjunction with readily available mold presses of the type manufactured, for example, by the Hull Corp. of Hatboro, Pa., U.S.A. Mold presses of the type described have relatively moveable upper and lower platen members. The upper platen member is provided with a vertical extending cylindrical passageway into which a charge of encapsulating material, such as an epoxy resin, is adapted to be placed. The resin in solid form is heated in a preheating oven prior to its deposit in the passageway so that it is already relatively soft in consistency. The resin is then placed within the cylindrical passageway where it is heated by heating elements extending around the passageway and becomes highly liquid within a relatively short period of time. A piston forces the liquified resin to flow from the bottom of the passageway outwardly through a series of runners to mold cavities for encapsulating objects as is known in the art.

SUMMARY AND OBJECTS OF THE INVENTION

The present invention involves the encapsulation of semi-conductor chips or similar objects fabricated on the surface of a carrier strip sometimes called a lead frame strip. The objects are encapsulated within a protective body preferably formed of a resin material, such as an epoxy, there being at least one and typically from about four to about six objects on each piece of carrier strip material. The invention in preferred form contemplates a method and apparatus for the encapsulation molding of plural chips mounted on one planar surface of each strip, the chips and the leads therefore being previously formed on the strip and being displaced axially of the strip in groups of from one to about six chips. The invention is intended to accommodate strips of different width and length, as well as strips having a range of numbers of chips, as well as sizes of chips, disposed thereon.

In carrying out the invention, one or more mold base members are adapted to be interfitted into recesses in a support platform mounted on a platen of the mold press. Each mold base member has an elongated recess formed in its upper surface. The recesses are dimensioned to accept any one of a group of chip carrying strips having different numbers or sizes of chips or strips which optionally may be of a range of lengths and widths. Preferably, the recesses in the base member have a uniform depth adapted to accommodate thicknesses of any of the strips of strip material. The invention further contemplates the provision of cover plates termed cavity inserts which have spaced apart cavities extending therethrough, there being one cavity insert reserved for each of the separate strips of the group of strips. The cavities within a cavity insert are equal in number to chips on the corresponding strip and are dimensioned so that they will fit over the chips to be encapsulated on that particular strip. Further in accordance with the invention, gate passages formed in the cavity inserts lead to each individual cavity for the particular strip. The gate passages are formed solely in the cavity inserts and are preferably formed on the surface of the cavity insert away from the mold base member.

The invention further provides locating pins which locate the strips within each recess within a mold base member and maintain the relative position of the mold base member, the strips and the cavity insert independent of the dimensions of the particular strip within the group of strips which the mold is intended to receive.

The invention further contemplates the use of knockout pins for the removal of solidified resin from the mold runner structure when the mold press is opened and a gate runner construction which promotes break off of the resin within the runners from the encapsulated parts as the resin is removed from the runners in a manner which leaves substantially no flashing on the encapsulated object. Still further, the knockout means includes push pins which operate in sequence with the knockout pins to push out the mold base member from its supporting recess once the resin within the runners has been knocked-out and separated from the encapsulated parts.

Advantages and objects of the invention are the provision of a mold structure comprising mold base members common to any one of a series of semi-conductor device carriers of a range of dimensions and having different numbers and/or sizes of semi-conductor devices carried thereon in combination with cavity inserts individual to each carrier strip of the group of strips.

A further object of the invention is a provision of molding apparatus in which the member exposed to the greatest degree of wear and likelihood of damage, namely the mold cavity insert, is of relatively simple construction and can be readily replaced at low cost when worn without the need to replace other elements of the mold structure.

Still another object of the invention is the provision of a mold construction which is simple to clean following use and minimizes down time during the encapsulation molding of parts.

A further object of the invention is the provision of knockout means for facilitating the removal of resin within the resin delivery runner system following encapsulation molding and the provides for removal of the mold from its support structure thereby facilitating production.

A still further object of the invention is the provision of a centering system for centering the chip carrying strips in position within the mold irrespective of differences in the number or size of the chips or the dimensions of the chip carrier strips.

Another objective of the invention is the provision of a strip locating system within the mold which allows for axial expansion of the elongated strips of strip material.

A still further object of the invention is the provision of a gate structure within the mold cavity insert which restricts the delivery of resin to the number of objects to be encapsulated thereby eliminating waste of resin.

Other objects and advantages of the invention will become apparent from the following detailed description of the preferred embodiment of the invention.

DETAILED DESCRIPTION OF THE PREFERRED EMBODIMENT OF THE INVENTION

Figure 1:
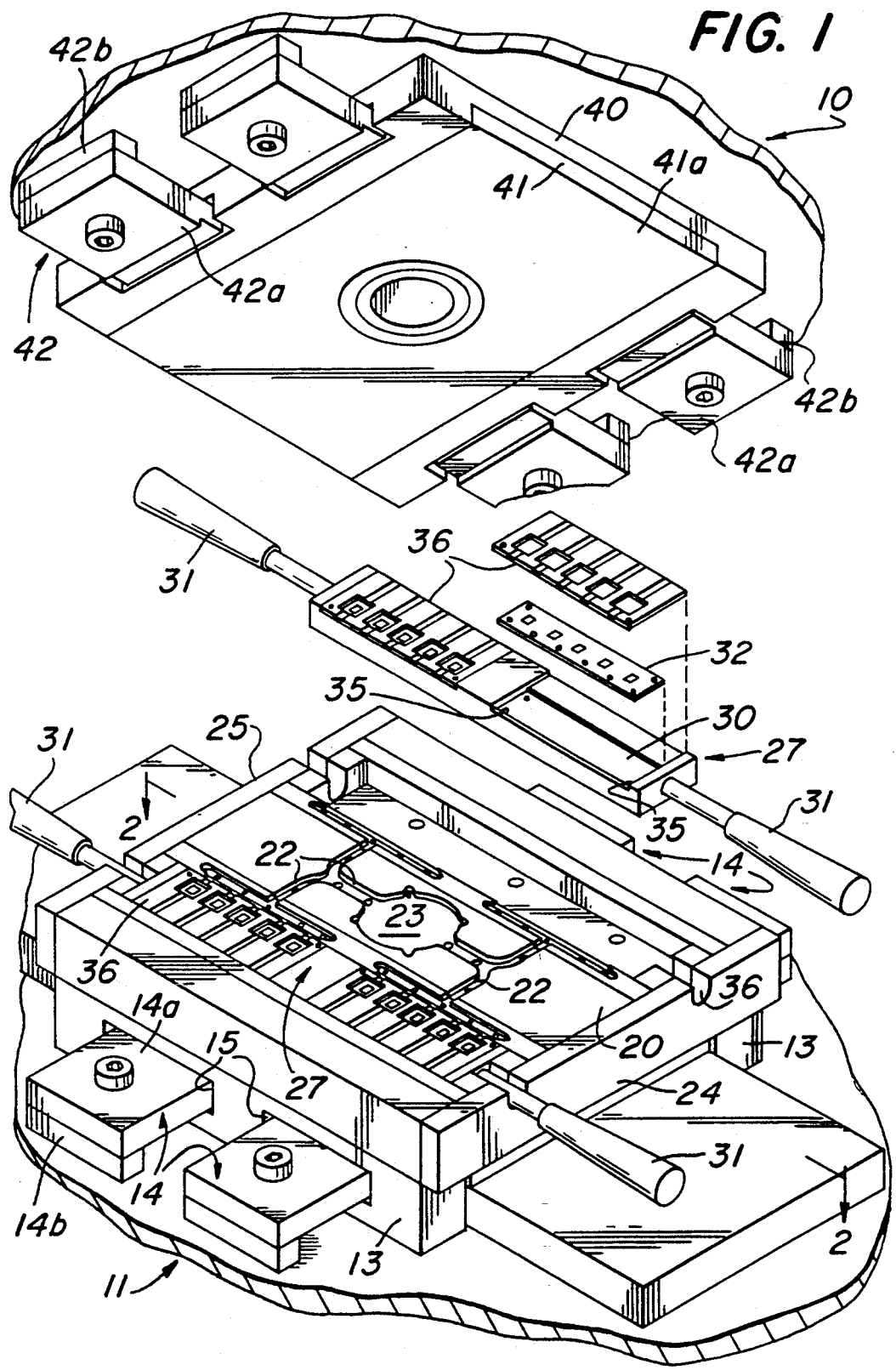
FIG. 1 is an exploded perspective view schematically representing molds formed in accordance with the present invention.
Figure 2:
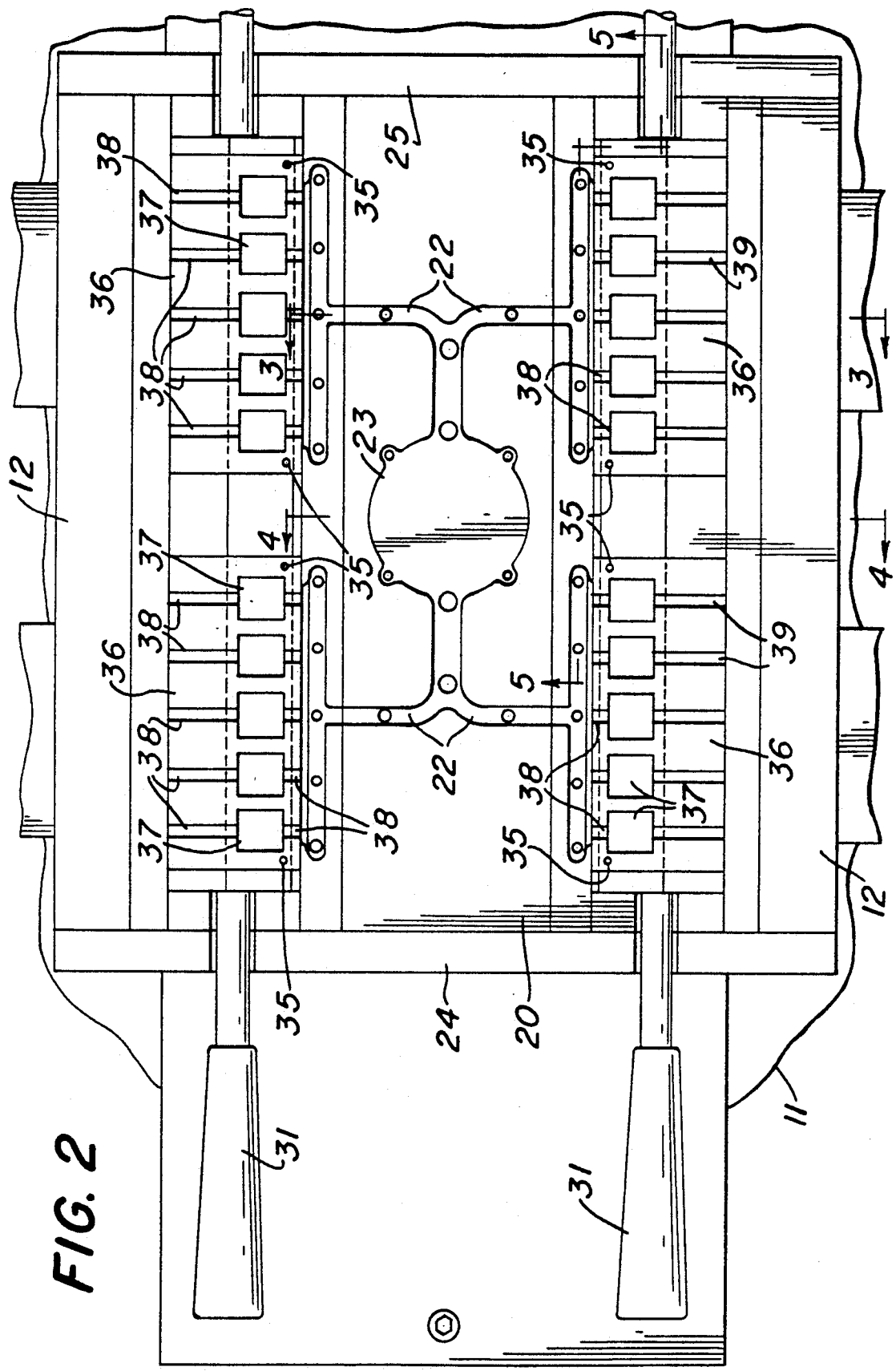
FIG. 2 is a plan view of the mold structure of FIG. 1 mounted on the lower platen member of a mold press.
Figure 3:
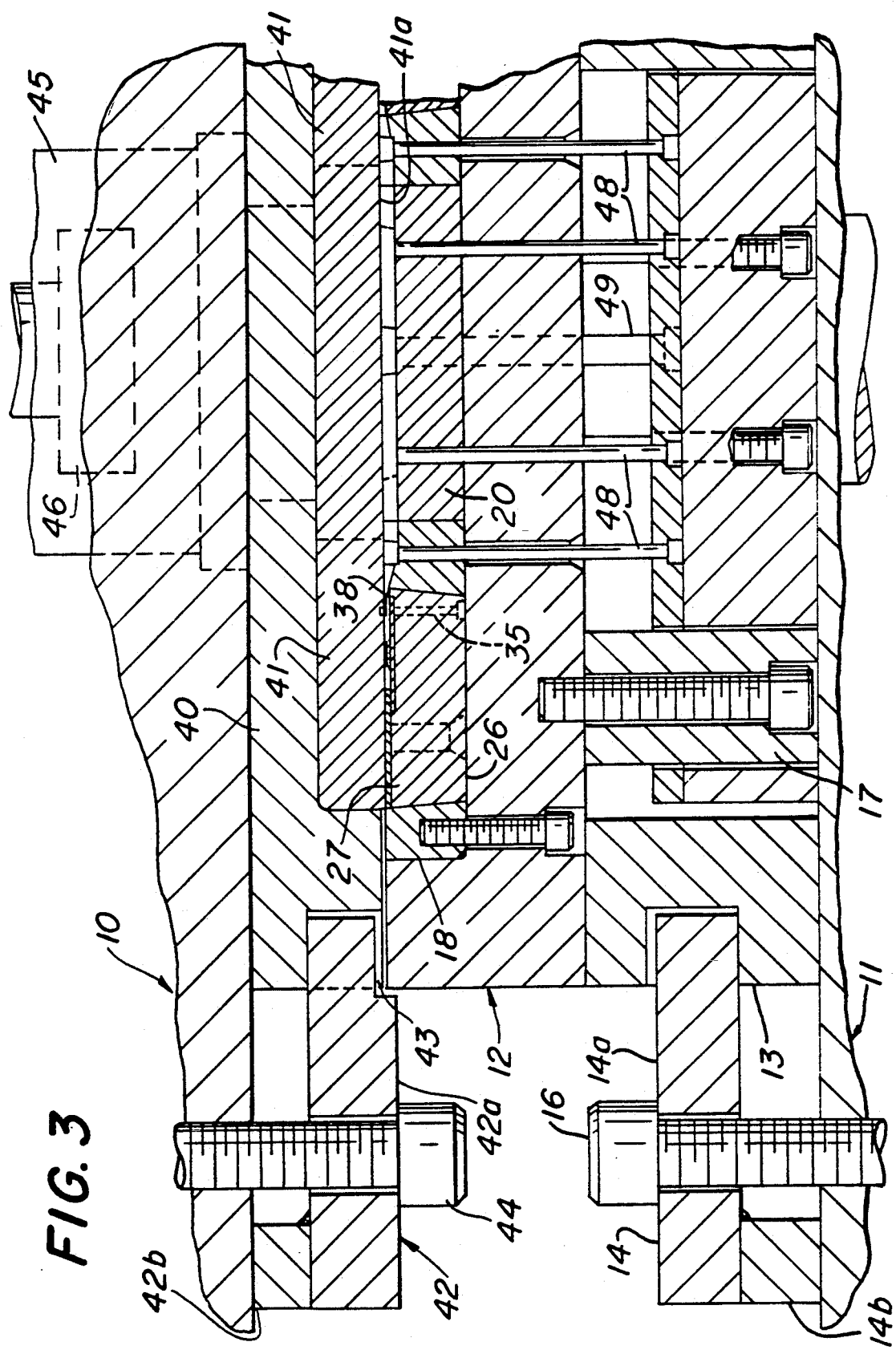
FIG. 3 is a sectional view taken on lines 3—3 of FIG. 2.
Figure 4:
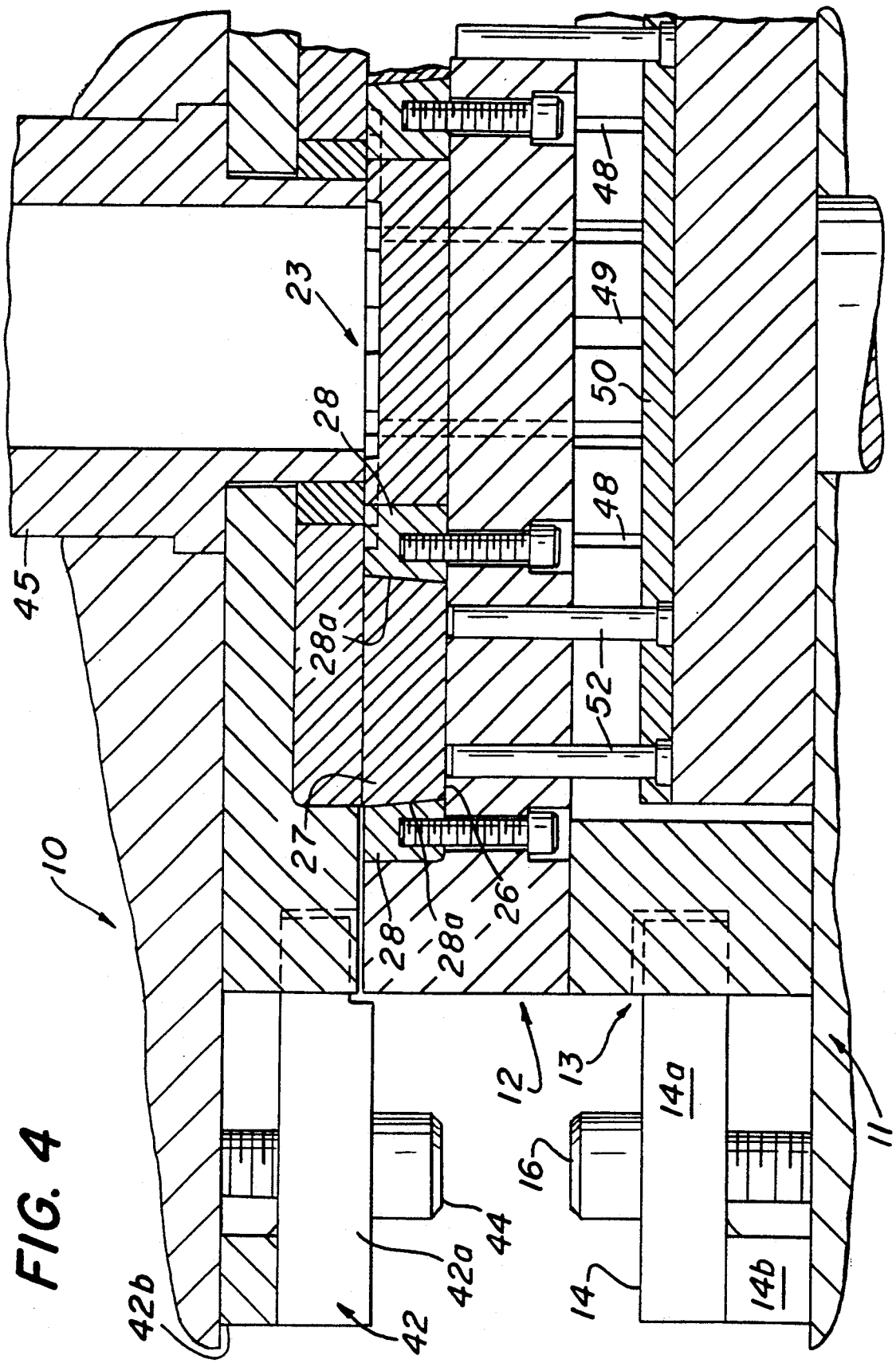
FIG. 4 is a sectional view taken on lines 4—4 of FIG. 2.

Referring first to FIGS. 1-4, the molding apparatus of the present invention is mounted in a mold press comprising an upper platen member 10 and a lower platen member 11, both of which are mounted for relative vertical movement by means, not shown, between an open position and the position illustrated in FIGS. 2-4 wherein the mold parts supported on the lower platen member 11 are clamped together prior to a molding operation as is known in the art. The mold press is of conventional construction and is generally of a type supplied by the Hull Corp., more fully identified above.

As is best seen in FIGS. 3 and 4, the mold comprises an elevated mold support platform 12 supported by elongated risers 13 which are clamped to the platen 11 by means of L shaped brackets 14. Brackets 14 have horizontally extending arms 14a which fit within spaced recesses 15 formed within the outer surface of risers 13 and bear against the platen on feet 14b. One or more machine bolts 16 directly bolt each bracket 14 to the lower platen 11 and clamp mold support platform 12 tightly in position. Support pillars 17 bolted to the underside of the platform may be provided as required to eliminate flexure when the parts of the mold are pressed together.

As best shown in FIGS. 2 and 3, mold support platform 12 has a central recessed portion 18 in the center of which an elongated center block 20 is mounted. As will be explained in more detail hereinafter, the upper surface of center block 20 provides a means for the delivery of liquified encapsulating resin through a series of branching runner passages generally indicated at 22 and which extend from a central recessed resin receptacle 23, as is best seen in FIGS. 1 and 2.

Figure 7:
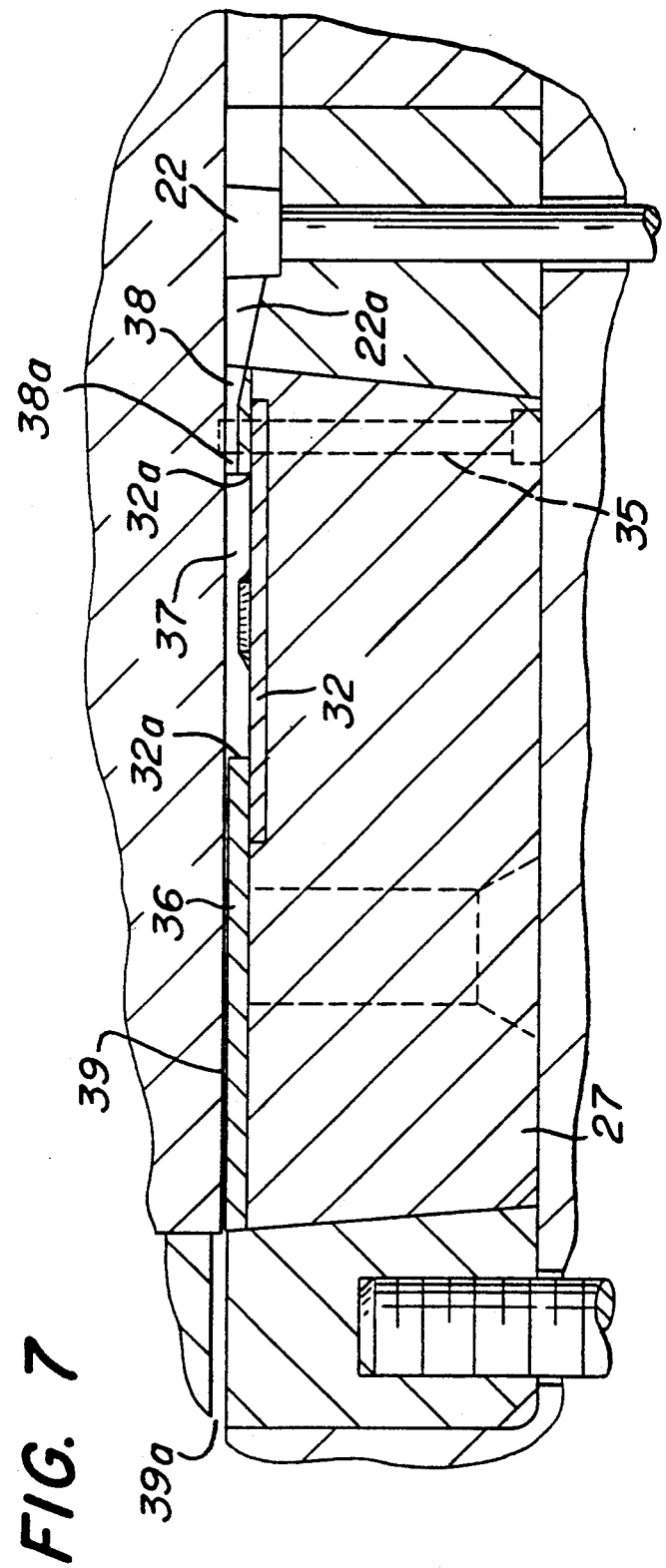
FIG. 7 is a fragmental view in cross-section of a mold bar and cavity, the view showing, on an enlarged scale, a portion of the section shown in FIG. 3.

Also secured to the sides of platform 12 are side frame members 24 and 25. The center block, the side frame members and the raised end edges of the support platform define a pair of elongated mold support recesses 26 in which removable elongated mold base members 27, described hereinafter, are adapted to be placed. As is best shown in FIGS. 3, 4 and 7, the sides of the recesses 26 may be provided in the form of separate, removable side members 28 bolted to the platform 12. Each side member 28 preferably has a tapered sidewall 28a. The tapered sidewalls 28a are complementary to corresponding tapers 29 formed in the sides of the mold base members. The tapered sides contribute to accurate positioning of the mold base members and facilitate their removal upon completion of a molding operation.

Two such mold base members 27 can best be seen in FIG. 1. The upper surface of each base member 27 has one or more elongated shallow recesses 30, there being two such recesses in the mold base member illustrated in FIG. 1. The mold base members further are preferably provided with handles 31 which extend from the ends of the base members and fit within notches 31a in the side frame members 24 and 25 to facilitate transportation, placement of the mold base member within in the mold and their removal at the conclusion of a molding operation.

Figure 6:
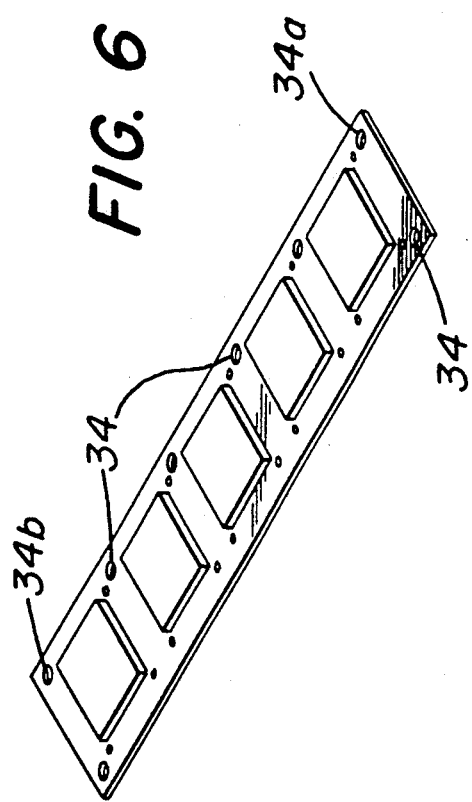
FIG. 6 is a view of one chip carrier strip showing the encapsulated chips according to the present invention.

Each recess 30 is intended to receive an elongated carrier strip 32 carrying a plurality of objects to be encapsulated, such as semi-conductor chips. The chips are prefabricated on the strip surfaces and have leads extending therefrom as required. One such strip with chips 33 already encapsulated is illustrated in FIG. 6. Although chips fabricated on conventional lead frame strips stamped from a conductive material, such as copper, may be encapsulated using the equipment and method of the invention, the strips are preferably formed of a plastic material and may have any number of chips, usually from about one to six, formed on the upper surface thereof in a predetermined spaced relationship.

The invention thus contemplates the provision of molding equipment intended for the encapsulation of plural objects, such as the semi-conductor chips of FIG. 6 of a predetermined different size, number and spacial relationship, mounted on the strips. The invention also contemplates that the strips may differ in length and width but preferably have a common thickness. In use, a typical strip has anywhere from one to about six chips on the upper surface thereof.

Figure 5:
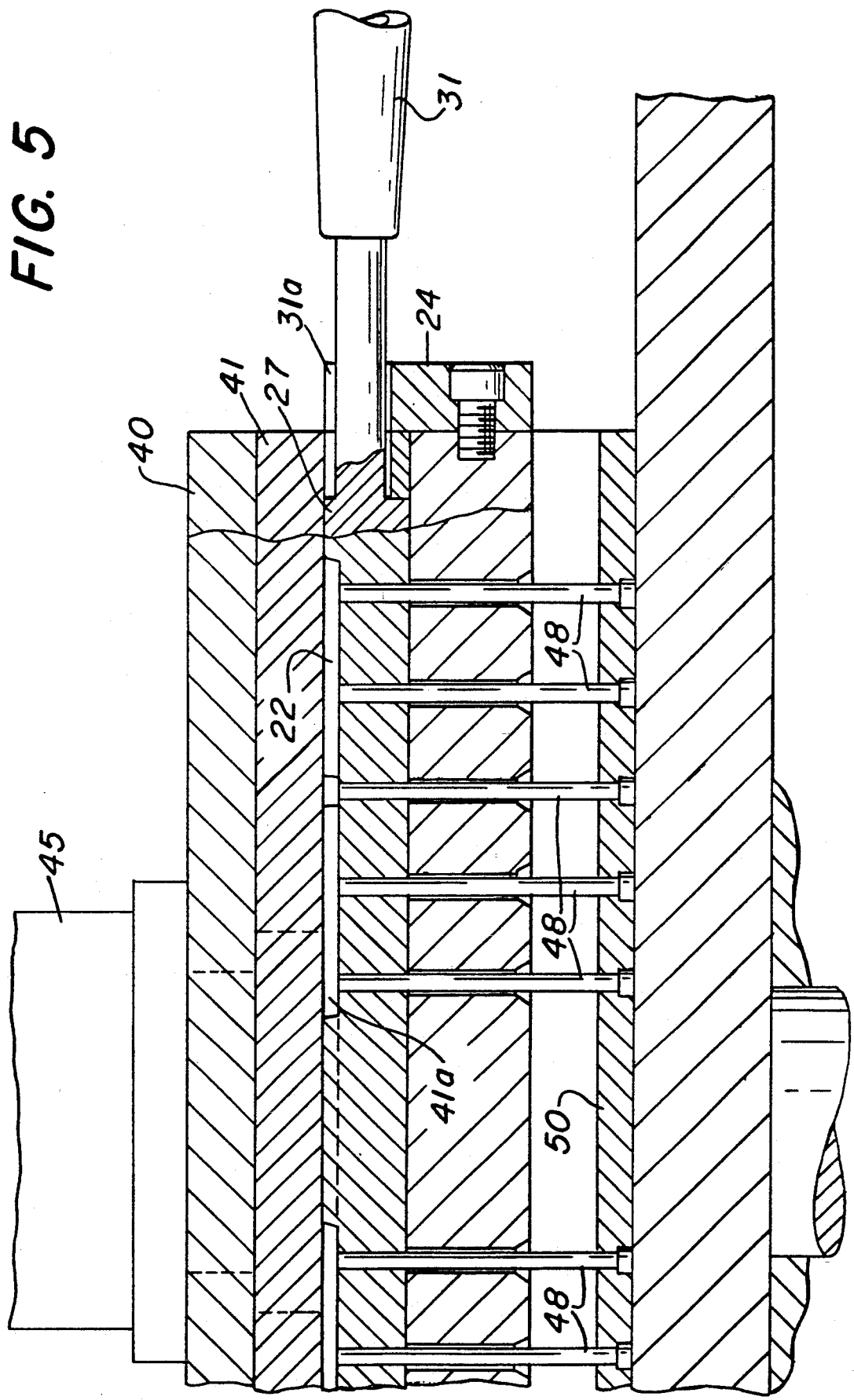
FIG. 5 is a sectional view taken of lines 5—5 of FIG. 2.

As can best be seen in FIGS. 5 and 7, the recess in the upper surface of each mold base member 27 is preferably of the same depth as the thickness of each of the strips 32.

The strips 32 are further provided with a series of indexing openings 34. The openings 34 are preformed on the strips in predetermined, fixed positions for use in cooperation with indexing equipment for indexing the strips during other chip fabricating procedures. Although other notches or holes could be provided for the purpose, two such openings, denominated 34a and 34b in FIG. 6, also serve as positioning openings for locating the strips in fixed position within the mold base members. As can be seen in FIGS. 1-3, 7 and 8, two pins 35 extend upwardly from the base of each recess 30 which fit within the openings 34 for the purpose of positioning each strip 32. Preferably, one of the pins should have a diameter substantially equal to the diameter of the corresponding pin so as to firmly locate one end of the strip axially of the cavity, whereas the other should be slightly smaller in an amount sufficient to allow for the calculated axial expansion of the strip which occurs due to the heat of the molding process.

The mold further includes means comprising cavity inserts 36 which are adapted to fit on the tops of the mold base members 27 covering each of the recesses 30 and providing a seal with the upper surface of each of strips 32, as shown at 32 in FIG. 7, and defining a plurality of cavities which receive the liquified encapsulating resin. The cavity inserts 36 each have plural spaced cavities 37 which extend therethrough. Each cavity is dimensioned to surround the chip or other object to be encapsulated.

In carrying out the objectives of the invention, a separate cavity insert 36 is provided for each of the different strips, depending upon the size and number of chips as well as their positioning on the individual strip with the cavities in the insert individual to a particular strip being spaced and dimensioned so that they surround the objects to be encapsulated when the strips are fitted within the recesses of the mold base member.

Each cavity insert 36 further has gate passages 38 which are spaced from the mold base member and preferably formed on the upper surface of the insert. These are best seen in FIGS. 1-3 and 7. The gate passages communicate with the cull portions of the runners 22, thus providing a flow passage for the liquid resin extending directly from the common resin receptacle 23 into the cavities 37. Shallow vents 39 extending from each cavity 36 are also formed in the upper surface of the cavity inserts and allow for the venting of gas and any excess resin from the cavities through a clearance space 39a.

As can be seen in FIG. 7, the portions of the runners 22 which extend along the side of each of the mold bars slope upwardly, as indicated at 22a, towards the edges of mold support recesses 26. The gate passages 38 continue this upward slope to a relatively shallow flat gate section 38a which promotes fracture of the solidified resin so that it can be easily separated from the encapsulated part once the mold is opened.

Referring to FIGS. 1 and 3, the upper mold structure comprises upper mold member 40 mounted on upper platen 10 and has a recess which receives an upper mold insert plate 41 having a lower planar surface 41a. Upper mold member 40 is clamped in position on the upper platen 10 by any suitable means, such as brackets 42, each having arms 42a and 42b. The arms of the brackets fit within recesses 43 within the sides of the upper mold member and are bolted to the platen by means such as machine bolts 44.

Centrally located within the upper platen member 10 and extending through the upper mold member 40 and the upper mold insert plate 41 is a cylindrical resin receptacle 45. The resin receptacle 45 is in axial alignment with the central receptacle 23 which is located centrally of the lower plate 20.

As indicated above, upper platen 10 and lower platen 11 are adapted for relative vertical movement toward and away from one and another for opening and closure of the mold. When the platens are moved together, upper mold insert 41 presses against the uppermost surface of each of the cavity inserts 36, as can be seen in FIG. 3. In this position, the resin receptacle 45 is in registry with and forms a seal around the perimeter of the resin receptacle 23. As is conventional in the art, encapsulating resin in pellet form is inserted into the upper end of the resin receptacle 45 in preheated and relatively soft form when the mold parts are clamped together, as shown in FIG. 3. Heater means surrounding the receptacle within the upper platen rapidly reduce the resin to a highly liquid form within receptacle 23. As can be seen in FIG. 3, a hydraulic operated piston 46, schematically represented, forces the resin outwardly through runner passages, through the cull and the gate passages so as to fill the mold cavities within each cavity insert.

Means are provided for facilitating the removal of the mold base members from the mold and the solidified resin from the runners and from the cull and the gate passages once the resin has solidified. As a preferred means to accomplish this, a series of resin knockout pins 48 are supported on a base plate 50 immediately beneath passages 22 and receptacle 23. Plate 50 rests on the platen 11 and is raised relatively to the platen 11 when the upper and lower platens move to the open position. The position of the knockout pins within the various runners can be seen in FIGS. 2-5 and 8.

Also mounted on base plate 50 are push pins 52 (FIG. 4) for knocking out the mold base members. The push pins are located immediately beneath the base of mold base member 27. The pins 48 and 52 are of a length relatively to one another such that when the mold opens, the knockout pins 48 first strike the solidified resin within the runners, lifting it up causing the resin to fracture within the narrow section of the gate immediately next to the encapsulated part. As the push pins 52 rise an additional amount, they then strike the bottom of the mold base members 27 pushing them out of their locating recesses. Thereafter as the mold parts move further apart, clearance is provided so that the operator can manually lift each mold base member from the mold recess 26 by grasping the handles 31. Thereafter, the solidified resin which has been upset by the knockout pins can be manually removed and the mold is readied substantially immediately for reuse.

Figure 8:
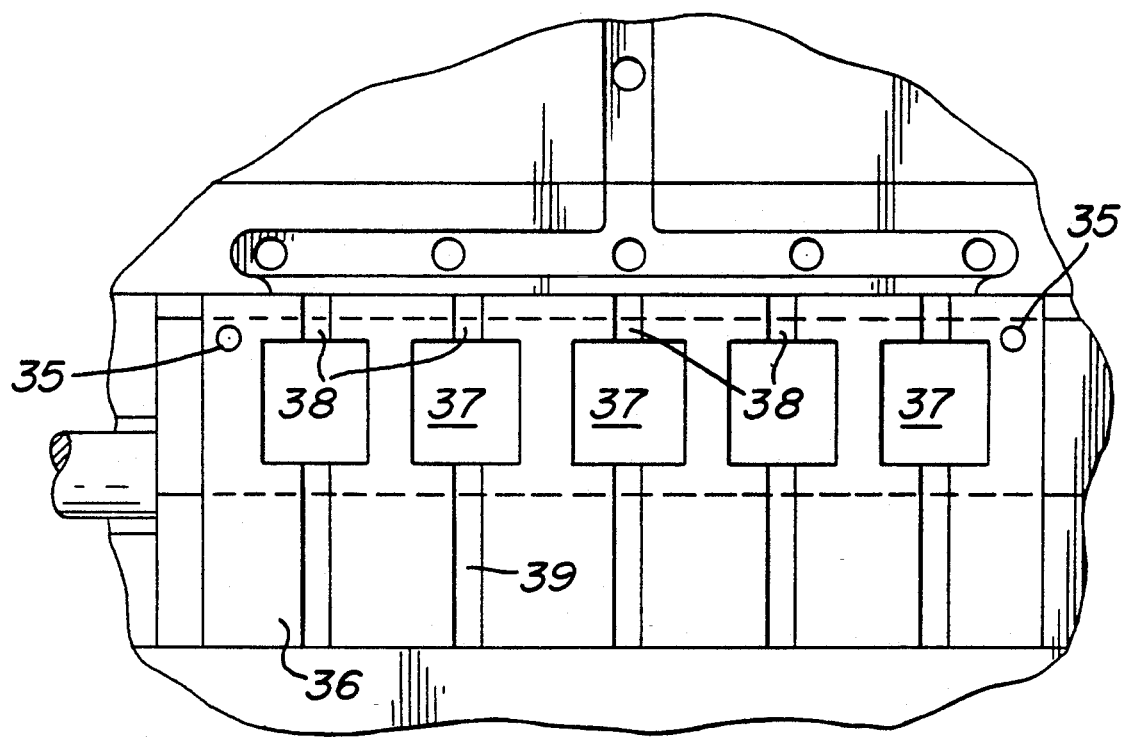
FIG. 8 is a partial plan view showing a mold cavity insert of the type illustrated in FIG. 2.

In operation of the molding equipment of the present invention, mold base members 27 are loaded with carrier strips 32 each carrying a predetermined number of chips to be encapsulated. In loading the strips 32, the openings 34 are fitted over pins 35, thereby positioning the strips within recesses 30. A cavity insert 36 having cavities corresponding to the number of chips on the particular strip 32 and otherwise dimensioned so that the cavities correspond to those on the strip is fitted into the top of each recess 30. As can be seen in FIGS. 1 and 8, the positioning pins 35 extend through the pair of openings in the cavity inserts so that each base member, strip and cavity insert are maintained in the intended relationship.

With the mold press open, the mold base members are next fitted into recesses 26 and the mold is closed. Preheated resin is then supplied to the upper opening in resin receptacle 45 and the piston 46 is actuated to force liquified resin from receptacle 23 through runners 22 into cavities 37.

Upon curing of the resin, the mold press opens, causing pins 48 and 49 to remove waste solidified resin from the runners 22 and the receptacle 23 and effecting a fracture of the resin within the shallow gate. Immediately thereafter, the knockout pins raise the mold base members from the recesses 26.

I claim:

1. Encapsulating mold equipment comprising:
   a mold press having a base platen, an upper platen having an upper mold plate overlying said base plate, said base platen and said upper platen being relatively moveable between an open position and a closed position;
   encapsulating fluid delivery means on said base platen, said encapsulating fluid delivery means including a surface raised relatively to said base platen and having runner passages formed therein for distribution of said fluid to the mold under pressure;
   a mold base member;
   means for support of said mold base member on said base platen in adjacent relationship to said raised surface and to the runner passages in said raised surface of said encapsulating fluid delivery means, said mold base member having a substantially imperforate upwardly facing substantially rectangular planar support surface for support of strip material having an upper surface with a plurality of spaced apart devices to be encapsulating disposed thereon, said strip material having a substantially flat lower surface interfacing with said upwardly facing planar support surface;
   a substantially rectangular cavity insert disposed on the mold base member, said cavity insert having a plurality of cavities extending therethrough, said cavities being spaced in end-to-end relationship lengthwise of the cavity insert and corresponding in number to the devices on the upper surface of said piece of strip material, the cavities being dimensioned and positioned to receive said devices and a charge of encapsulating fluid sufficient to form an encapsulating layer covering each said device on said piece of strip material, said cavity insert having a lower sealing surface surrounding each cavity and cooperating with the upper surface of said strip material on said upwardly facing planar support surface to form with said strip material a seal surrounding each said device, said cavity insert further having an upper sealing surface cooperating with said upper mold plate to form a seal with said upper mold plate when the upper and lower platens are in the closed position; and
   said cavity insert having first and second side edges and gate passage means comprising gate grooves formed exclusively in said upper sealing surface, said gate grooves extending from said cavities to a first of said side edges, said gate grooves and said runner passages in said raised surface being in fluid communication when the cavity insert is disposed on said mold base member for the delivery of a charge of encapsulating fluid from said runner passages through said gate passage to each of said cavities.

2. Encapsulating mold equipment according to claim 1, wherein said mold base member is a portable member and wherein said support means includes means for positioning said mold base member and said cavity inset in a fixed position relatively to said base platen with the raised surface and the upper surface of the cavity insert being coplanar when the mold base member is supported on said base platen.

3. Encapsulating mold equipment according to claim 2, further including vent passages for said cavities, said vent passages comprising vent grooves formed exclusively in said upper sealing surface and extending from said cavities to the second of said side edges.

4. Encapsulating mold equipment according to claim 3, wherein said upwardly facing planar support surface comprises a recess having a depth equal to the thickness of the strip material on said support surface, said cavity insert being supported on said mold base member.

5. Encapsulating mold equipment according to claim 4, each said mold base member having a plurality of said upwardly facing recessed planar support surfaces, said recessed planar support surfaces being disposed on said mold base members in end-to-end relationship and being adapted to each receive one of said strips of material.

6. Encapsulating mold equipment according to claim 5, wherein said runner passages include a portion common to all of said gate passages in said cavity insert, said common portion joining all of said gate passages for delivering said encapsulating fluid to said cavities directly through said gate passages.

7. Encapsulating mold equipment according to claim 6, wherein said mold base member includes a pair of handle members extending from opposite ends thereof.

8. Encapsulating mold equipment according to claim 7, further including at least one indexing pin projecting upwardly from each said upwardly facing planar support surface, there being corresponding index openings on each strip and each cavity insert of said series, each index opening being positioned to orient a strip of said series and a cavity insert individual to the strip of said series in a predetermined position on said planar support surface.

9. Encapsulating mold equipment for use with a mold press, said equipment comprising:
   a base platen for support of a mold and an upper platen overlying said base platen;
   a center plate supported on said base platen and having a pair of substantially parallel side edges;
   end and side frame members disposed on opposite sides of said center plate;
   the parallel side edges of said center plate and said end and side frame members forming a pair of substantially rectangular positioning recesses;
   a pair of substantially rectangular, portable mold base members dimensioned to interfit within said positioning recesses, said positioning recesses being dimensioned to maintain said mold base members in fixed position relatively to said base platen, said mold base members having upwardly facing planar support surfaces for support of strip material having an upper surface with spaced apart devices to be encapsulated thereon;

said center plate having an upper planar surface having grooves forming runner passages formed therein, said grooves terminating at the parallel side edges of the center plate;

an elongated cavity insert having substantially parallel edges disposed in overlying relationship on each said mold base member planar support surface, each said cavity insert having a side edge abutting one of said parallel side edges of said center plate and a plurality of spaced mold forming cavities extending therethrough, said cavities corresponding in number to the devices on the upper surface of a piece of said strip material positioned on each said planar support surface, said cavities being dimensioned and positioned to receive said devices and a charge of encapsulating thermosetting resin sufficient to form an encapsulating layer covering said devices, each said cavity insert having a lower sealing surface surrounding each cavity and cooperating with the upper surface of said strip material on said upwardly facing planar support to form a seal surrounding each device, each said cavity insert further having an upper sealing surface cooperating with said upper mold plate when the upper and lower platens are in the closed position, said upper sealing surface of said cavity insert being coplanar with the upper planar surface of the center plate;

gate and vent passages formed exclusively in the upper planar surface of each cavity insert, said gate passages extending from each cavity to the side edge abutting one of said side edges of said center plate and said vent passages extending from the cavities to the opposite side edge of the cavity insert, said gate passages joining with the runner passage terminating at the adjacent side edge of the center plate; and means for delivery of encapsulating resin through said runner passages, said gate passages to each of said cavities.

* * * * *

UNITED STATES PATENT AND TRADEMARK OFFICE
CERTIFICATE OF CORRECTION

PATENT NO. : 5,316,463

DATED : May 31, 1994

INVENTOR(S) : H. Karl Neu

It is certified that error appears in the above-identified patent and that said Letters Patent is hereby corrected as shown below:

Column 5, line 68, before "42b" insert --feet--

Signed and Sealed this

Thirteenth Day of September, 1994

*Attest:*

BRUCE LEHMAN

*Attesting Officer*     *Commissioner of Patents and Trademarks*